(12) United States Patent
Jaussi et al.

(10) Patent No.: US 7,664,215 B2
(45) Date of Patent: Feb. 16, 2010

(54) SIGNAL ALIGNMENT BASED ON DATA SIGNAL

(75) Inventors: James E. Jaussi, Hillsboro, OR (US);
Sriram Venkataraman, Bangalore (IN);
Bryan K. Caspar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 777 days.

(21) Appl. No.: 11/316,448

(22) Filed: Dec. 21, 2005

(65) Prior Publication Data

US 2007/0140397 A1      Jun. 21, 2007

(51) Int. Cl.
*H03D 3/24* (2006.01)
(52) U.S. Cl. ...................................... 375/375
(58) Field of Classification Search ................. 375/354, 375/359, 360, 362, 371–377; 327/141, 155, 327/156, 100, 162, 163, 185, 199, 205
See application file for complete search history.

(56) References Cited

U.S. PATENT DOCUMENTS 7,076,377 B2 *   7/2006  Kim et al. ...................... 702/66

2003/0086517 A1 *   5/2003  Vallet et al. .................. 375/355
2006/0062341 A1 *   3/2006  Edmondson et al. ........ 375/376
2006/0140321 A1 *   6/2006  Tell et al. ..................... 375/376

OTHER PUBLICATIONS

Fiedler et al: FP 15.1: A 1.062Gbps Transceiver with 2x-Oversampling and Transmit Signal Pre-Emphasis; 1997 IEEE Int'l Solid-State Circuits Conference; p. 238-239 & 464.
Lee et al: A 40-Gb/x Clock and Data Recovery Circuit in 0.18-μm CMOS Technology; Dec. 2003; IEEE Journal of Solid-State Circuits, vol. 38, No. 12; pp. 2181-2190.
Yang et al: A 0.5-μm CMOS 4.0-Gbit/s Serial Link Tranceiver with Data Recovery Using Oversampling; May 1998 IEEE Journal of Solid-State Circuits, vol. 33, No. 5; pages.

* cited by examiner

*Primary Examiner*—Tesfaldet Bocure
*Assistant Examiner*—Vineeta S Panwalkar
(74) *Attorney, Agent, or Firm*—Caven & Aghevli LLC (57) ABSTRACT

Alignment of a receiver clock signal with a transmitter clock signal based upon a received data signal is disclosed. Some embodiments generate, based upon of phase bits and valid phase bits, a phase signal having a voltage level selected from at least three voltage levels. One voltage level corresponds to shifting the receiver clock signal in a first direction. Another voltage level corresponds to shifting the receiver clock signal in a second direction. The other voltage level corresponds to repeating a previous shift of the receiver clock signal.

19 Claims, 6 Drawing Sheets

SIGNAL ALIGNMENT BASED ON DATA SIGNAL

BACKGROUND

Alignment of transmitter clock signal and receiver clock signal may be accomplished by a receiver tracking phase of an incoming data signal. If the phase of the data signal is early with respect to the receiver clock signal, then the receiver may pump up an oscillator to increase the frequency or advance the phase of the receiver clock. Similarly, if a phase of the data signal is late with respect to the receiver clock signal, then the receiver may pump down an oscillator to decrease the frequency or retard the phase of the receiver clock. By pumping up or down the receiver clock, the receiver may maintain alignment between the receiver clock signal and the transmitter clock signal.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

In the following detailed description, numerous specific details are described in order to provide a thorough understanding of the invention. However the present invention may be practiced without these specific details. In other instances, well known methods, procedures, components and circuits have not been described in detail so as not to obscure the present invention. Further, example sizes/models/values/ranges may be given, although the present invention is not limited to these specific examples.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
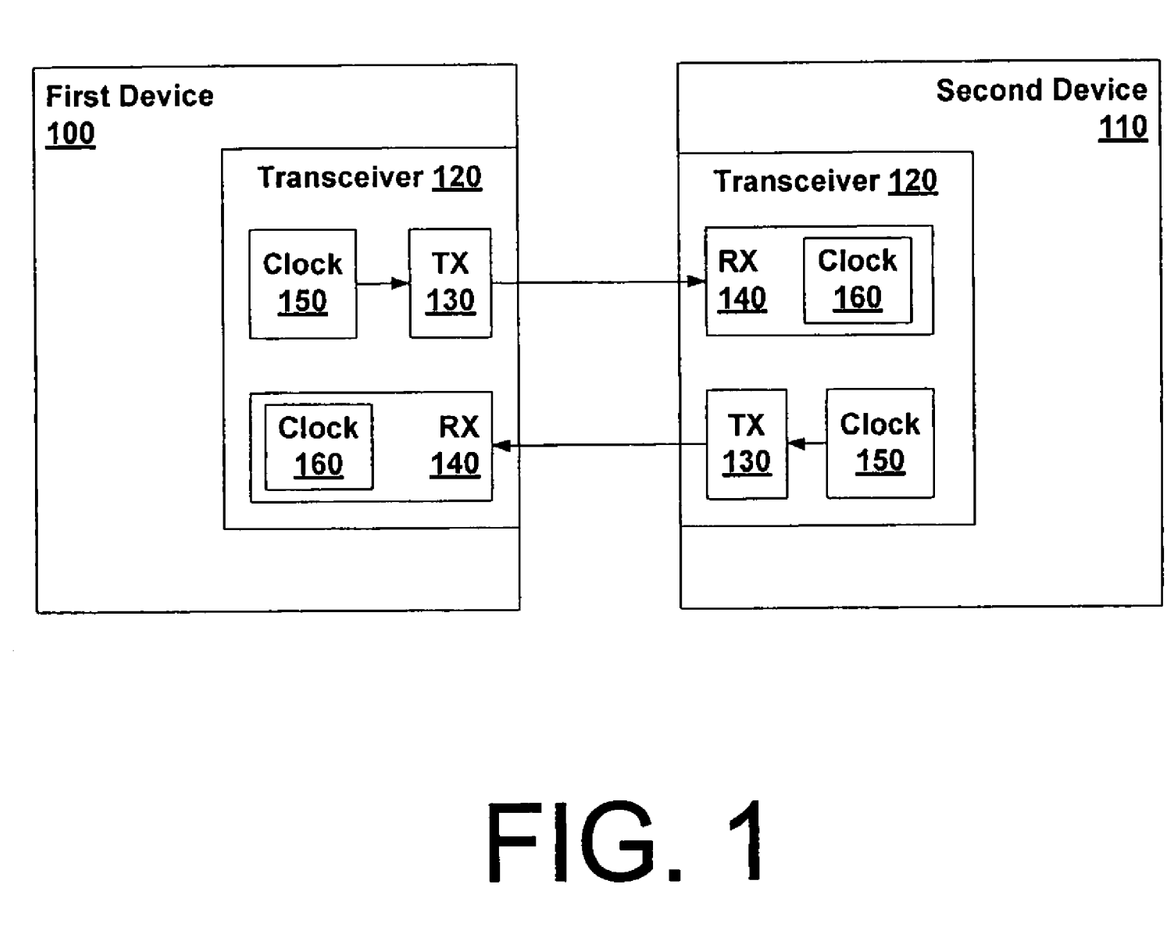
FIG. 1 illustrates an embodiment of a transmission system.

Referring to FIG. 1, an embodiment of a transmission system comprising a plurality of devices 100, 110 is shown. The devices 100, 110 may for example comprise computer systems, I/O devices, chipsets, microprocessors and/or a combination of said devices. As shown, each device 100, 110 may comprise a transceiver 120 to serially send and receive data signals. The transceiver 120 may comprise a transmitter 130, a receiver 140, and a transmitter clock 150. The transmitter clock 150 may generate a transmitter clock signal to drive the transmitter 130, and the transmitter 130 may serially transmit a plurality of data bits based upon the transmitter clock signal. Furthermore, the receiver 140 may comprise a receiver clock 160 that generates a receiver clock signal based upon the data signal received from a transmitter 130, and the receiver 140 may capture data bits of the data signal based upon the receiver clock signal provided by the receiver clock 160.

Figure 2A:
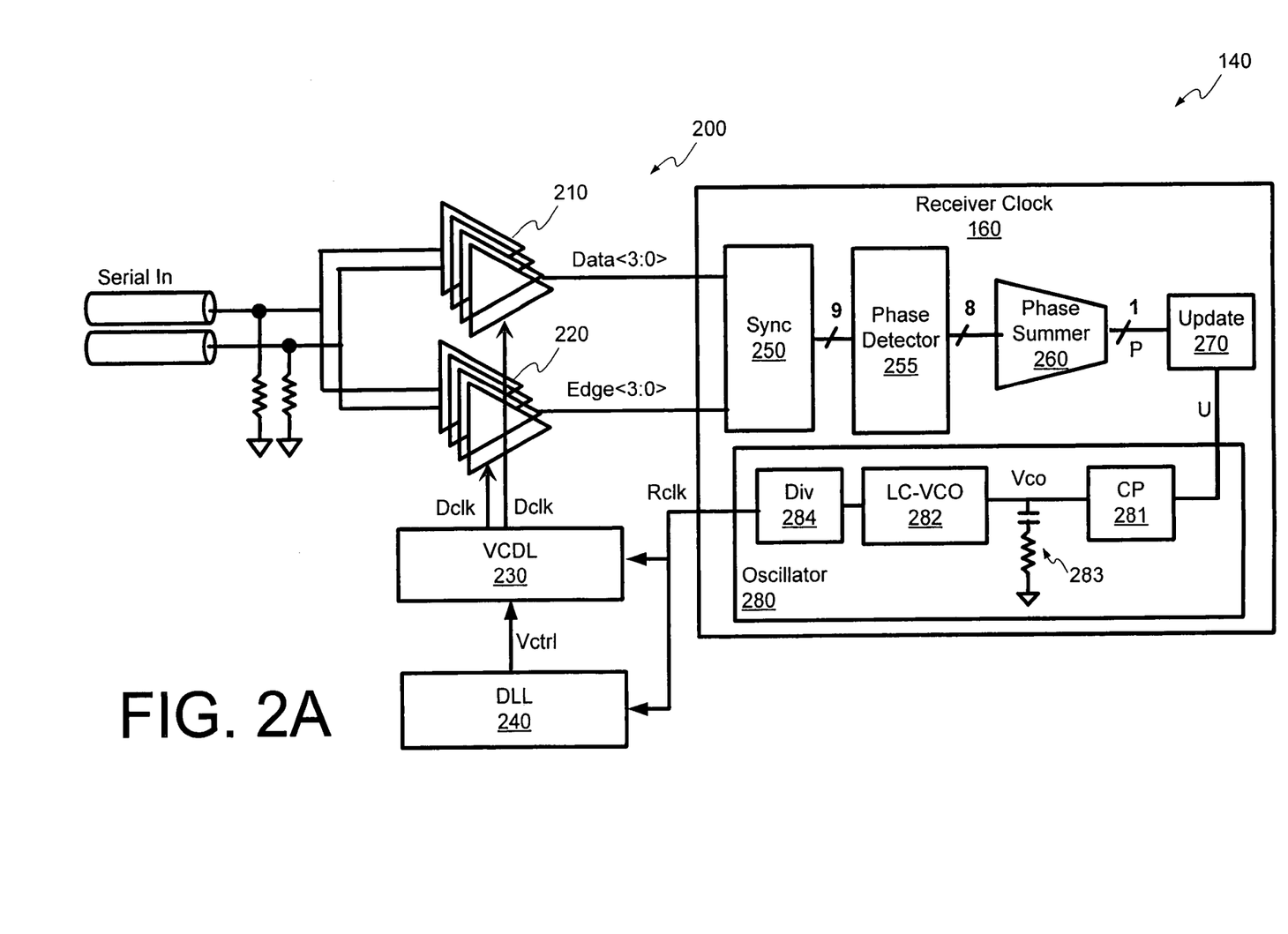
FIGS. 2A and 2B illustrate embodiments of a receiver of the transmission system depicted in FIG. 1.

Referring now to FIG. 2A, one embodiment of the receiver 140 is illustrated. As depicted, the receiver 140 may comprise a 4-way interleaved front end interface 200 coupled to the receiver clock 160. The 4-way interleaved front end interface 200 may enable individual components of the receiver to operate at one fourth of the data transmission rate. For example, the transmitter 130 may serially transmit data bits at a transmission rate of 20 Gbps (gigabits per second) while the receiver clock signal Rclk and some of the components of the front end interface operate at 5 GHz (gigahertz).

To this end, the front end interface 200 may comprise four data eye units 210, four data edge units 220, a voltage controlled delay line 230, and a delay locked loop 240 that collectively oversample the incoming data signal at twice the incoming data rate while individually operating at one fourth the incoming data rate. In one embodiment, the delay locked loop 240 may receive the receiver clock signal Rclk from the receiver clock 160 and may generate a control voltage Vctrl based upon the received clock signal Rclk. The voltage controlled delay line 230 may receive the control voltage Vctrl and the receiver clock signal Rclk, and may delay the receiver clock signal Rclk based on the control voltage Vctrl such that delayed receiver clock signals Dclk cause each of the data eye units 210 to sample and latch a separate eye of four successive data bits of the serially transmitted data signal. Similarly, in one embodiment, the voltage controlled delay line 230 may receive the control voltage Vctrl and the receiver clock signal Rclk, and may delay the receiver clock signal Rclk such that delayed receiver clock signals Dclk cause each of the data edge units 220 to sample and latch a separate trailing edge of the eyes latched by the four data eye units 210.

The data eye units 210 may provide the sampled data bits DATA<3:0> to a synchronizer 250 of the receiver clock 160 and the data edge units 210 may provide the sampled edge bits EDGE<3:0> to the synchronizer 250 of the receiver clock 160. The synchronizer 250 may receive the four data bits DATA<3:0> and the four edge bits EDGE<3:0> from the data eye units 210 and the data edge units 210 and may provide five data bits DATA<4:0> and four edge bits EDGE<3:0> to a phase detector 255 at roughly the same time. In one embodiment, the synchronizer 250 may serially receive the data bits DATA<3:0> and the edge bits EDGE<3:0> from the data eye units 210 and the data edge units 210 and may provide the data bits DATA<4:0> and the edge bits EDGE<3:0> to the phase detector 255 in parallel. Moreover, the synchronizer 250 may wait until five data bits (e.g. four data bits DATA<3:0> plus the following data bit DATA<0>) are received from the data eye units 210 before providing the data bits DATA<4:0> to the phase detector 255.

The phase detector 255 may generate a plurality of phase bits PHASE<3:0> and valid phase bits VALID<3:0>. Each phase bit PHASE<3:0> may indicate whether a corresponding data bit DATA<3:0> of the data signal was received early or late in respect to the receiver clock signal. Similarly, each valid phase bit VALID<3:0> may indicate whether a phase bit PHASE<3:0> corresponds to a valid transition or edge between two successive data bits DATA<4:0> of the data signal. For example, if the received data signal comprises a 1-1-1-0 sequence, then no valid edge information may be contained in the 1-1-1 portion of the sequence, since no data transition occurred. However, a valid edge of the phase data may be present in the 1-0 portion of the sequence. Similarly, if the received data signal comprises a 0-0-0-1 sequence, then no valid edge information may be contained in the 0-0-0 portion of the sequence, since no data transition occurred. However, a valid edge of the phase data may be present in the 0-1 portion of the sequence.

The phase summer 260 may sum together the digital phase bits PHASE<3:0> that correspond to digital valid phase bits VALID<3:0> to generate an analog phase signal P indicative of whether the data bits are early or late with respect to the receiver clock signal Rclk. In one embodiment, the phase summer 260 may generate an analog phase signal P having one of at least three voltage level. One voltage level may correspond to a request to pump up the receiver clock 160 in order to increase the frequency or advance the phase of the receiver clock signal Rclk, one voltage level may correspond to a request to pump down the receiver clock 160 in order to decrease the frequency or retard the phase of the receiver clock signal Rclk, and another level may correspond to maintaining or repeating the previous request (e.g. a pump up or pump down request).

The update logic 270 may determine based upon the analog phase signal P whether to adjust the frequency of the receiver clock signal Rclk in order to better align the phase of the data bits with the phase of the receiver clock signal Rclk. In one embodiment, the update logic 270 may generate an update signal U to request the oscillator 280 to increase the frequency or advance the phase of the receiver clock signal Rclk in response to the phase signal P indicating that the data bits are early. Similarly, the update logic 270 may generate an update signal U to request the oscillator 280 to decrease the frequency or retard the phase of the receiver clock signal Rclk in response to the phase signal P indicating that the data bits are late.

In one embodiment, the oscillator 280 may comprise a charge pump 281, an inductor capacitor voltage controlled oscillator (LC-VCO) 282, a loop filter 283, and a frequency divider 284. The charge pump 281 may pump up or increase an output voltage Vco used to control the LC-VCO 282 in response to the update signal U requesting an increase in the frequency and the charge pump 281 may pump down or decrease the output voltage Vco in response to the update signal U requesting a decrease in the frequency. The loop filter 283 may filter the output voltage Vco of the charge pump 281 to smooth the changes in the output voltage Vco. In one embodiment, the LC-VCO 282 may generate a signal having a frequency of roughly 10 GHz. The frequency divider 284 may receive the 10 GHz signal and produce the roughly 5 GHz receiver clock signal Rclk expected by one embodiment of the front end 200.

Figure 2B:
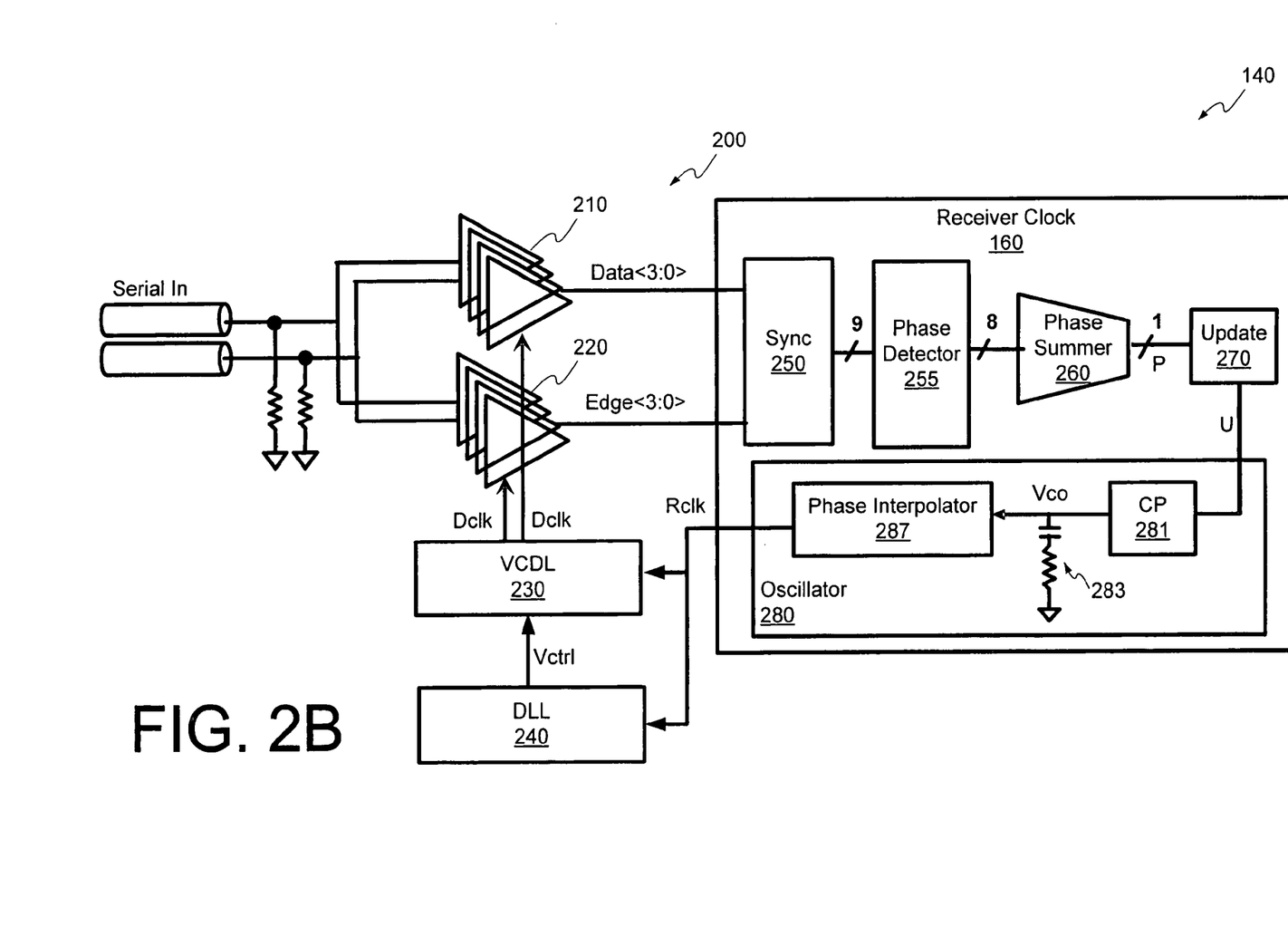

In another embodiment as depicted in FIG. 2B, the oscillator 280 may comprise a charge pump 281, a loop filter 283, and a phase interpolator 287. The charge pump 281 may pump up or increase an output voltage Vco used to control the phase interpolator 287 in response to the update signal U requesting the phase be advanced and the charge pump 281 may pump down or decrease the output voltage Vco in response to the update signal U requesting the phase be retarded. The loop filter 283 may filter the output voltage Vco of the charge pump 281 to smooth the changes in the output voltage Vco. The phase interpolator 287 may generate the receiver clock signal Rclk and may adjust the phase of the receiver clock signal Rclk based upon the output voltage Vco.

Figure 3:
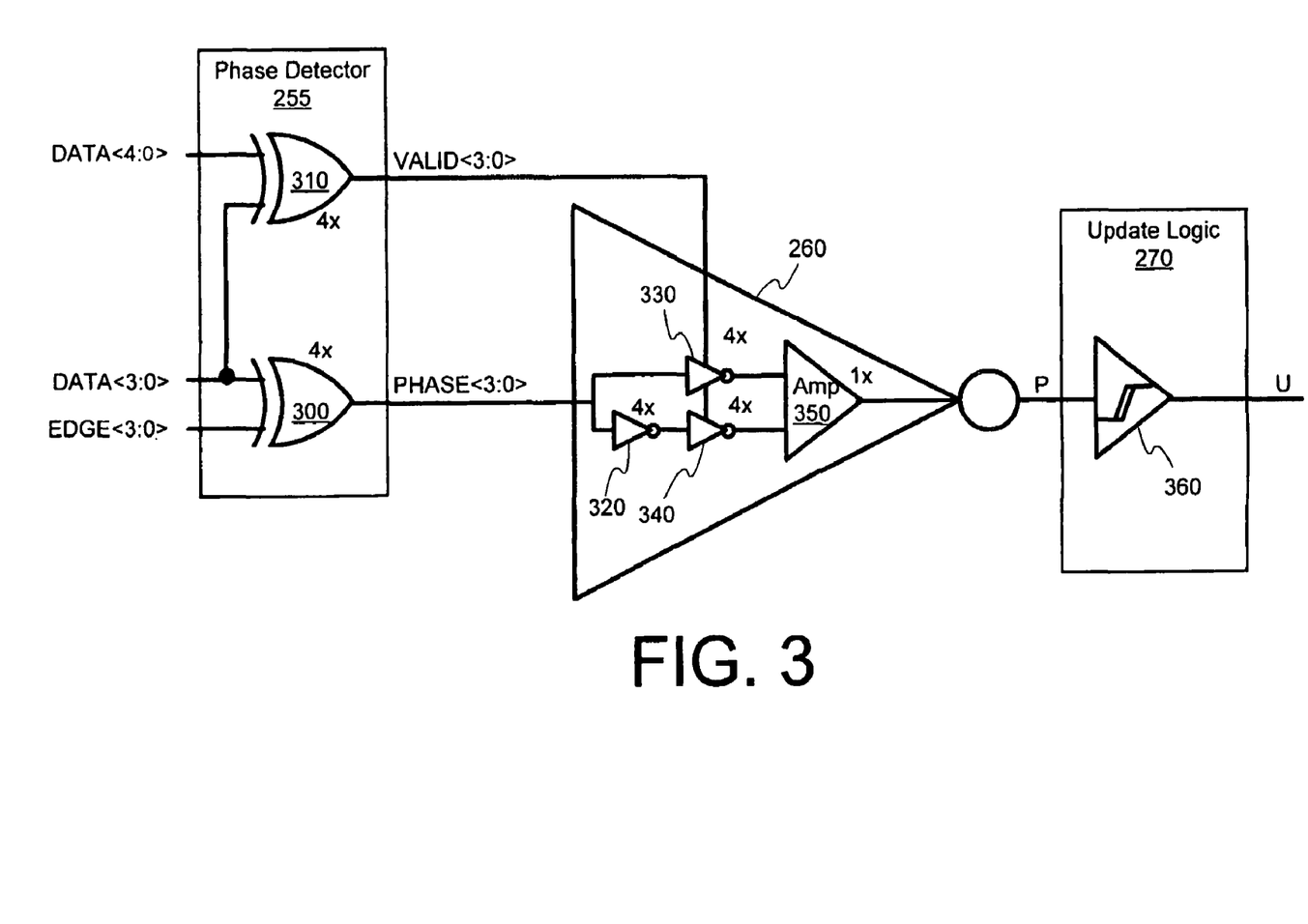
FIG. 3 illustrates an embodiment of a phase detector, phase summer, and an update logic of the receivers depicted in FIGS. 2A and 2B.

Reference is now made to FIG. 3, which depicts an embodiment of the phase detector 255, phase summer 260, and update logic 270. In one embodiment, the phase detector 255 may comprise four XOR gates 300 and four XOR gates 310. The four XOR gates 300 may receive data bits DATA<3:0> and edge bits EDGE<3:0> and may generate phase bits PHASE<3:0> based on the received data bits DATA<3:0> and edge bits EDGE<3:0>. In particular, one XOR gate 300 may receive a first data bit DATA<0> and a corresponding first edge bit EDGE<0> and may generate a phase bits PHASE<0> that indicates the first data bit DATA<0> is late if the first data bit DATA<0> and the corresponding first edge bit EDGE<0> have the same value and that indicates the first data bit DATA<0> is early if the first data bit DATA<0> and the corresponding first edge bit EDGE<0> have different values.

Further, the four XOR gates 310, in one embodiment, may receive data bits DATA<4:0> and may generate valid phase bits VALID<3:0> based on the received data bits DATA<4:0>. In particular, one XOR gate 310 may receive a first data bit DATA<0> and a successive second data bit DATA<1> and may generate a valid phase bit VALID<0> that indicates the first data bit DATA<0> corresponds to a transition or edge of the data signal if the first data bit DATA<0> and the successive second data bit DATA<1> have different values and that indicates the first data bit DATA<0> does not correspond to a transition or edge of the data signal if the first data bit DATA<0> and the successive second data bit DATA<1> have the same value.

The phase summer 260 in one embodiment may comprise four inverters 320, four tri-state inverters 330, and four tri-state inverters 340. The phase summer 260 as depicted in FIG. 3 operates like a tri-state inverter or digital to analog converter that sums together digital phase bits PHASE<3:0> associated with valid edges to obtain an analog phase signal P indicative of whether digital phase bits PHASE<3:0> represent a majority of pump up requests or a majority of pump down requests. In particular, the inverters 320, 330, 340 may receive the digital phase bits PHASE<3:0>, and the valid phase bits VALID<3:0> may cause the tri-state inverters 330, 340 to pass on the digital phase bits PHASE<3:0> that correspond to valid data transitions to an amplifier 350. The tri-state inverters 330, 340 and amplifier 350 may sum phase bits PHASE<3:0> of valid edges to generate an analog phase signal P having one of 7 output voltages such as, for example, $V_{CC}$, $\frac{3}{4}V_{CC}$, $\frac{2}{3}V_{CC}$, $\frac{1}{2}V_{CC}$, $\frac{1}{3}V_{CC}$, $\frac{1}{4}V_{CC}$ and $V_{SS}$.

Figure 4:
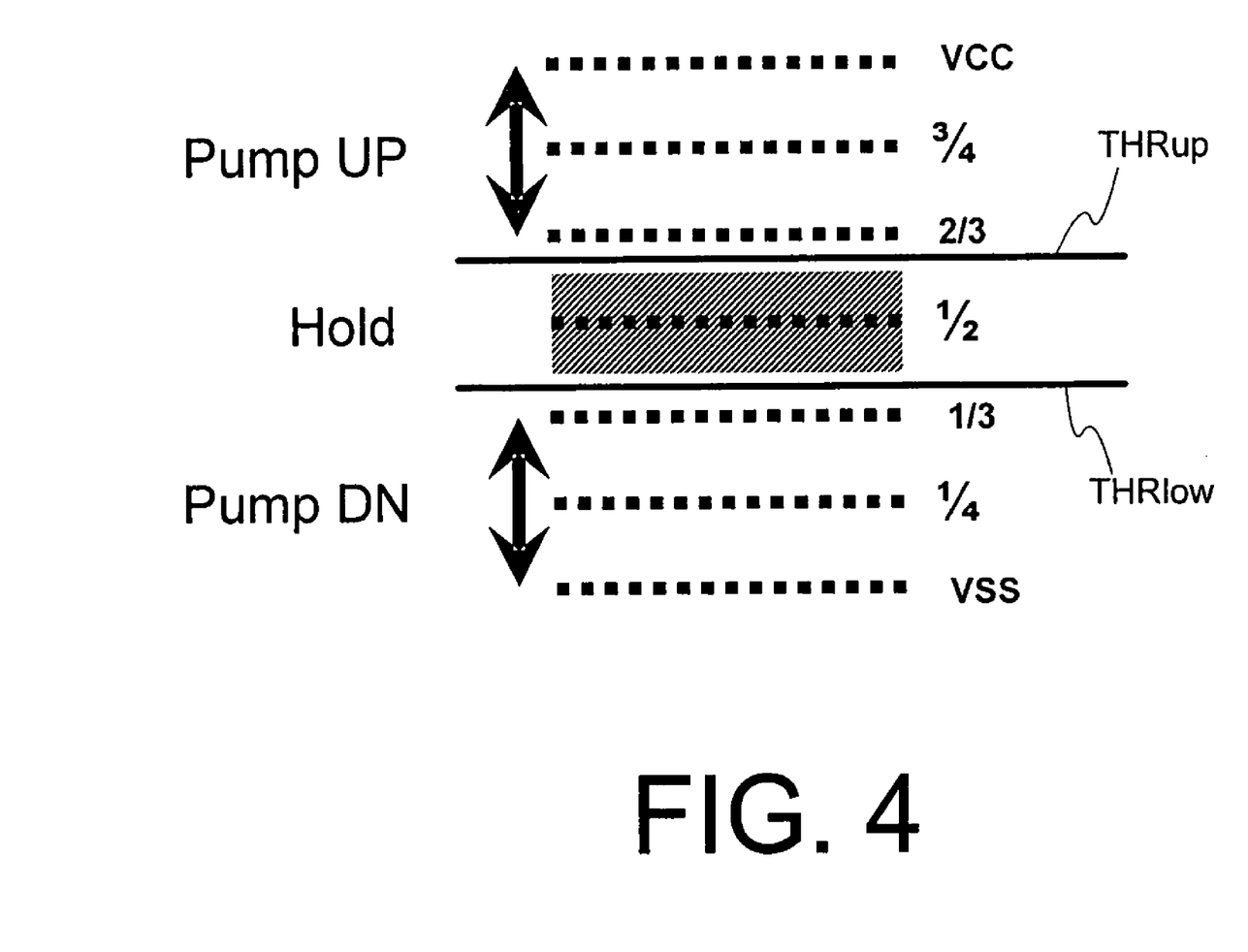
FIG. 4 illustrate a relationship of a phase signal of the phase summer of FIG. 3 to upper and lower thresholds of the update logic of FIG. 3.

The update logic 270 may determine based upon the phase signal P whether to pump up or pump down the receiver clock 160, and may generate an update signal U to request the oscillator 280 to increase or decrease the frequency of the receiver clock signal Rclk. In one embodiment, the update logic 270 may comprise a Schmitt trigger 360 to receive the phase signal P and to generate the update signal U. In particular, the Schmitt trigger 360 may have an upper threshold set between ½ Vcc and ⅔ Vcc (e.g. 0.6 Vcc) and may have a lower threshold set between ½ Vcc and ⅓ Vcc (e.g. 0.4 Vcc). Accordingly, the Schmitt trigger 360 may generate an update signal U that requests of a pump up or increase of the oscillator 280 when the phase signal P is greater than the upper threshold (e.g. a phase signal of Vcc, ¾ Vcc, or ⅔ Vcc). Conversely, the Schmitt trigger 360 may generate an update signal U that requests a pump down or decrease of the oscillator 280 when the phase signal P is less than the lower threshold (e.g. a phase signal of Vss, ¼ Vcc, and ⅓ Vcc). Further, the Schmitt trigger 360 may generate an update signal U that retains or holds its previous request (e.g. a pump up or a pump down request) of the oscillator 280 when the phase signal P is between the upper threshold and the lower threshold (e.g. a phase signal of ½ Vcc). The relationship of the phase signal P to the upper threshold THRup and the lower threshold THRlow is depicted in FIG. 4.

The following TABLE I depicts inputs and corresponding outputs of the update logic 270 and the inverters 320, 330, 340 and the amplifier 350 of the phase summer 260. As depicted, the phase summer 260 and update logic 270 generate a pump up request when the majority of phase bits PHASE<3:0> of valid phases indicate a pump up. Conversely, the phase summer 260 and update logic 270 generate a pump down request when the majority of phase bits PHASE<3:0> of valid phases indicate a pump down. Furthermore, the phase summer 260 and update logic 270 retain or hold a previously generated request when the valid phase bits do not indicate a majority of pump ups or pump downs.

TABLE I

| Number of Valid Edges | Up/Down Combination | Phase Signal Output Voltage | Update Signal Up/Down Indication |
| --- | --- | --- | --- |
| 4 | 4 up | Vcc | Up |
| 4 | 3 up, 1 down | ¾ Vcc | Up |
| 4 | 2 up, 2 down | ½ Vcc | Hold pervious state |
| 4 | 1 up, 3 down | ¼ Vcc | Down |
| 4 | 4 down | Vss | Down |
| 3 | 3 up | Vcc | Up |
| 3 | 2 up, 1 down | ⅔ vcc | Up |
| 3 | 1 up, 2 down | ⅓ vcc | Down |
| 3 | 3 down | Vss | Down |
| 2 | 2 up | Vcc | Up |
| 2 | 1 up, 1 down | ½ Vcc | Hold pervious state |
| 2 | 2 down | Vss | Down |
| 1 | 1 up | Vcc | Up |
| 1 | 1 down | Vss | Down |

Figure 5:
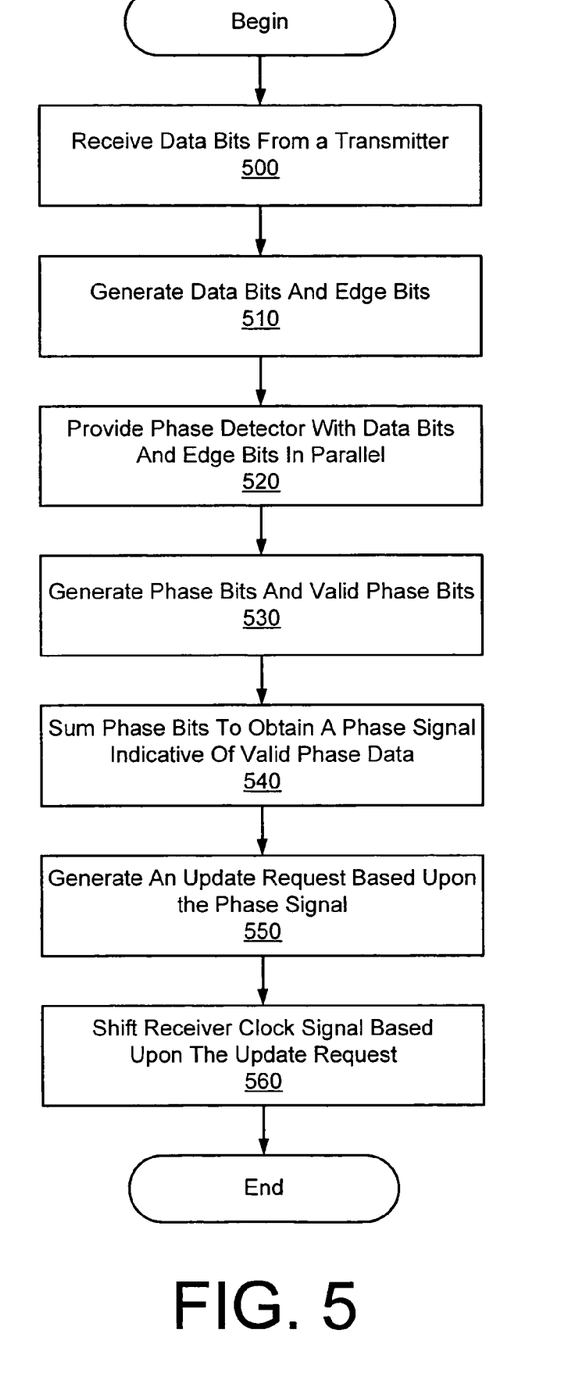
FIG. 5 illustrates operation of the receivers depicted in FIGS. 2A and 2B.

Reference is now made to FIG. 5 which depicts the operation of the receiver 140. In block 500, the data eye units 210 and data edge units 220 of the front end interface 200 may receive a data signal from the transmitter 130 that comprises a plurality of serially transmitted data bits. The data eye units 210 and the data edge units 220 may sample the data signal and may provide the receiver clock 160 with data bits DATA<3:0> and edge bits EDGE<3:0> in block 510.

In block 520, the synchronizer 250 may serially receive data bits DATA<3:0> and edge bits EDGE<3:0> from the front end interface 200 and may provide data bits DATA<4:0> and the edge bits EDGE<3:0> to the phase detector 255 in parallel. In particular, the synchronizer 250 may wait to until five data bits (e.g. four data bits DATA<3:0> plus the following data bit DATA<0>) are received from the data eye units 210 before providing the data bits DATA<4:0> to the phase detector 255.

In block 530, the phase detector 255 may generate phase bits PHASE<3:0> and valid phase bits VALID<3:0> based upon received data bits DATA<4:0> and received edge bits EDGE<3:0>. The phase summer 260 in block 540 may sum the phase information of the phase bits PHASE<3:0> associated with valid phase transitions. In particular, the phase summer 260 may generate an analog phase signal P having a voltage level dependent upon the received phase bits PHASE<3:0> and valid phase bits VALID<3:0>. As indicated above, the phase summer 260 may generate the phase signal P such that phase signal P has one of at least three voltage levels. In particular, the phase signal P may have one of 7 voltage levels (e.g. $V_{CC}$, $\frac{3}{4}V_{CC}$, $\frac{2}{3}V_{CC}$, $\frac{1}{2}V_{CC}$, $\frac{1}{3}V_{CC}$, $\frac{1}{4}V_{CC}$ and $V_{SS}$) in one embodiment.

In block 550, the update logic 270 may generate an update request signal U to request the oscillator 280 to shift the receiver clock signal Rclk in respect to the data bits<3:0>. In one embodiment, the update logic 270 may request the oscillator 280 shift the receiver clock 160 in a first direction in response to the phase signal P being greater than an upper threshold. Further, the update logic 270 may request the oscillator 280 to shift the receiver clock 160 in a second direction in response to the phase signal P being less than a lower threshold. Moreover, the update logic 270 may maintain a previous update request signal U (e.g. a pump up or pump down) to the oscillator 280 if the phase signal P is between the upper threshold and the lower threshold.

The oscillator 280 in block 560 adjusts the receiver clock signal Rclk based upon the received update request signal U. In one embodiment, the oscillator 280 increases the frequency or advances the phase in response to a pump up request or a request to shift in the first direction being received from the update logic 270. Further, the oscillator 280 decreases the frequency or retards the phase in response to a pump down request or a request to shift in the second direction being received from the update logic 270.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A method comprising
  receiving a data signal from a transmitter that comprises a plurality of data bits transmitted serially based upon a transmitter clock signal,
  generating a plurality of phase bits, each phase bit indicative of whether a corresponding data bit of the plurality of data bits was received early in respect to a receiver clock signal,
  generating a plurality of valid phase bits, each valid phase bit indicative of whether a corresponding phase bit corresponds to a data transition between two successive data bits of the plurality of data bits, and
  generating, based upon the plurality of phase bits and the plurality of valid phase bits, a phase signal having an analog voltage level indicative of whether to shift the receiver clock in respect to the plurality of data bits.

2. The method of claim 1 further comprising sampling the data signal based upon the receiver clock signal to obtain a plurality of data bits and a plurality of data edge bits, wherein the generating of the plurality of phase bits comprises generating the plurality of phase bits based upon the plurality of data bits and the plurality of edge bits.

3. The method of claim 1 further comprising sampling the data signal based upon the receiver clock signal to obtain a plurality of data bits, wherein the generating of the plurality of phase bits comprises generating the plurality of valid phase bits based upon the plurality of data bits.

4. The method of claim 1 further comprising
  increasing frequency of the receiver clock signal in response to the analog voltage level of the phase signal being greater than an upper threshold, and decreasing the frequency of the receiver clock signal in response to the analog voltage level of the phase signal being less than a lower threshold.

5. The method of claim 1 further comprising
advancing the phase of the receiver clock signal in response to the analog voltage level of the phase signal being greater than an upper threshold,
retarding the phase of the receiver clock signal in response to the analog voltage level of the phase signal being less than a lower threshold, and
repeating a previous adjustment of the receiver clock signal in response to the analog voltage level of the phase signal being between the upper threshold and the lower threshold.

6. The method of claim 1 wherein generating the phase signal comprises generating the analog voltage level for the phase signal to be greater than a threshold in response to a majority of the plurality of phase bits associated with valid phases requesting an increase in frequency of the receiver clock signal.

7. The method of claim 1 wherein generating the phase signal comprises generating the analog voltage level for the phase signal to be less than a threshold in response to a majority of the plurality of phase bits associated with valid phases requesting phase of the receiver clock signal be retarded.

8. The method of claim 1 wherein generating the phase signal comprises generating the analog voltage level for the phase signal to be between an upper threshold and a lower threshold in response the plurality of phase bits associated with valid phases indicating no majority of requests to increase frequency of the receiver clock signal and no majority of requests to decrease in the frequency of the receiver clock signal.

9. An apparatus comprising
a phase detector to generate a plurality of digital phase bits and a plurality of digital valid phase bits,
phase summer to sum the plurality of digital phase bits of valid phases identified by the plurality of digital valid phase bits to obtain a phase signal having an analog voltage level that is greater than an upper threshold in response to the plurality of digital phase bits of valid phases indicating a majority of early data bits with respect to a receiver clock signal, and that is less than a lower threshold in response to the plurality of digital phase bits of valid phases indicating a majority of late data bits with respect to the receiver clock signal, and
update logic to adjust a frequency of the receiver clock based upon the analog voltage level of the phase signal.

10. The apparatus of claim 9 wherein the update logic comprises a Schmitt trigger to receive the phase signal, to generate a request to advance phase of the receiver clock signal in response to the analog voltage level of the phase signal being greater than the upper threshold, and to generate a request to retard the phase of the receiver clock signal in response to the analog voltage level of the phase signal being less than the lower threshold.

11. The apparatus of claim 9 further comprising a voltage controlled oscillator to generate the receiver clock signal, wherein the voltage controlled oscillator adjusts frequency of the receiver clock signal based an update signal generated by the update logic.

12. The apparatus of claim 9 further comprising a phase interpolator to generate the receiver clock signal, wherein the phase interpolator adjusts phase of the receiver clock signal based an update signal generated by the update logic.

13. The apparatus of claim 9 wherein the phase summer generates the analog voltage level for the phase signal to be between the upper threshold and the lower threshold in response to the plurality of phase bits of valid phases indicating no majority of early data bits and no majority of late data bits.

14. The apparatus of claim 13 wherein the update logic comprises a Schmitt trigger to receive the phase signal, to generate a request to increase frequency of the receiver clock signal in response to the analog voltage level of the phase signal being greater than the upper threshold, to generate a request to decrease the frequency of the receiver clock signal in response to the analog voltage level of the phase signal being less than the lower threshold, to repeat a previous request in response to the analog voltage level of the phase signal being between the upper threshold and the lower threshold.

15. The apparatus of claim 13 wherein the update logic generates a request to advance phase of the receiver clock signal in response to the analog voltage level of the phase signal being greater than the upper threshold, generates a request to retard the phase of the receiver clock signal in response to the voltage level of the phase signal being less than the lower threshold, and repeats a previous request in response to the analog voltage level of the phase signal being between the upper threshold and the lower threshold.

16. A system comprising
a transmitter to transmit a plurality of data bits via a data signal transmitted based upon a transmitter clock signal, and
a receiver to sample the data signal based upon a receiver clock signal to obtain the plurality of data bits and a plurality of data edge bits, to generate a plurality of phase bits and a plurality of valid phase bits based upon the plurality of data bits and the plurality of data edge bits, to sum the plurality of phase bits of valid phases identified by the plurality of valid phase bits to obtain a voltage level for a phase signal, to shift the receiver clock signal in a first direction in response to the voltage level of the phase signal indicating a majority of early data bits with respect to the receiver clock signal, to shift the receiver clock signal in a second direction in response to the voltage level of the phase signal indicating a majority of late data bits with respect to the receiver clock signal, and to repeat a previous adjustment of the receiver clock signal in response to the voltage level of the phase signal indicating no majority of early data bits and no majority of late data bits.

17. The system of claim 16 wherein the receiver comprises a Schmitt trigger to determine to shift the receiver clock signal in the first direction in response to the voltage level of the phase signal being greater than an upper threshold, and to determine to shift the receiver clock signal in the second direction in response to the voltage level of the phase signal being less than a lower threshold.

18. The system of claim 16 wherein the receiver comprises
a Schmitt trigger to generate an update signal to shift the receiver clock signal in a first direction in response to the voltage level of the phase signal being greater than an upper threshold, and to generate the update signal to shift the receiver clock signal in a second direction in response to the voltage level of the phase signal being less than a lower threshold, and
a voltage controlled oscillator to increase frequency of the receiver clock signal in response to the update signal requesting a shift in the first direction and to decrease the frequency of the receiver clock signal in response to the update signal requesting a shift in the second direction.

19. The system of claim 16 wherein the receiver comprises a Schmitt trigger to generate an update signal to shift the receiver clock signal in a first direction in response to the voltage level of the phase signal being greater than an upper threshold, and to generate the update signal to shift the receiver clock signal in a second direction in response to the voltage level of the phase signal being less than a lower threshold, and a phase interpolator to advance phase of the receiver clock signal in response to the update signal requesting a shift in the first direction and to retard the phase of the receiver clock signal in response to the update signal requesting a shift in the second direction.

* * * * *

UNITED STATES PATENT AND TRADEMARK OFFICE
CERTIFICATE OF CORRECTION

PATENT NO. : 7,664,215 B2            Page 1 of 1
APPLICATION NO. : 11/316448
DATED : February 16, 2010
INVENTOR(S) : Jaussi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1085 days.

Signed and Sealed this

Twenty-eighth Day of December, 2010

David J. Kappos
*Director of the United States Patent and Trademark Office*